United States Patent [19]

Yen

[11] Patent Number: 4,737,387

[45] Date of Patent: Apr. 12, 1988

[54] REMOVABLE PELLICLE AND METHOD

[76] Inventor: Yung-Tsai Yen, 1192 St. Anthony Ct., Los Altos, Calif. 94022

[21] Appl. No.: 882,772

[22] Filed: Jul. 7, 1986

[51] Int. Cl.[4] ............................................. A47G 1/12
[52] U.S. Cl. .................................... 428/14; 156/60; 355/122; 428/45
[58] Field of Search ................. 430/5; 428/13, 33, 34, 428/65, 68, 14, 15; 355/122, 125

[56] References Cited

U.S. PATENT DOCUMENTS

| 150,497 | 5/1874 | Van Wagner et al. | 355/125 |
|---|---|---|---|
| 4,31,363 | 12/1978 | Shea et al. | 355/53 X |
| 3,272,422 | 9/1966 | Miller | 229/43 |
| 3,848,596 | 11/1974 | Pennau | 428/40 X |
| 4,252,846 | 2/1981 | Romesberg et al. | 428/35 |
| 4,470,508 | 9/1984 | Yen | 206/334 |
| 4,482,591 | 11/1984 | Ward | 428/66 |
| 4,537,813 | 8/1985 | Kuyel | 430/5 |
| 4,624,557 | 11/1986 | Winn | 355/122 X |
| 4,634,270 | 1/1987 | Yokoo et al. | 355/125 |

Primary Examiner—Henry F. Epstein
Attorney, Agent, or Firm—44Kolisch, Hartwell & Dickinson

[57] ABSTRACT

A composite frame for a free-standing membrane is provided. The frame includes a first frame member which is to be mounted to a planar surface such that a working area is defined on the planar surface, a second frame member for peripherally supporting the membrane, and a removable mounting between the first and second frame members so that the membrane protects and covers the working area. Another aspect of the disclosure is a method for using a pellicle, which includes the steps of mounting a first frame member to a planar surface such that a working area is defined, and then removably mounting a pellicle to the first frame member so that the working area is protected by the pellicle.

18 Claims, 1 Drawing Sheet

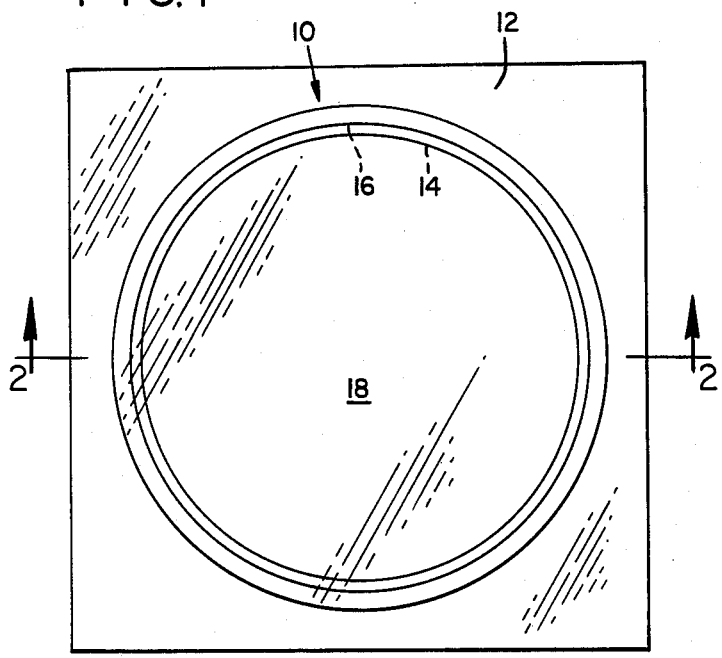
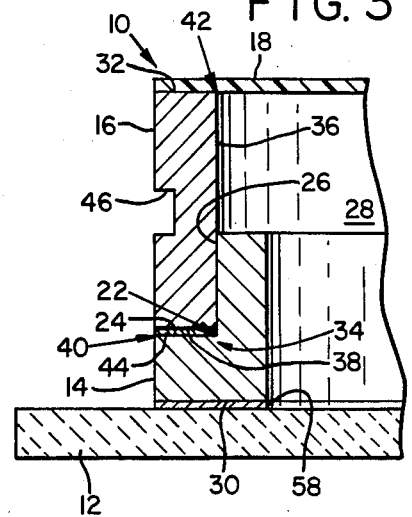
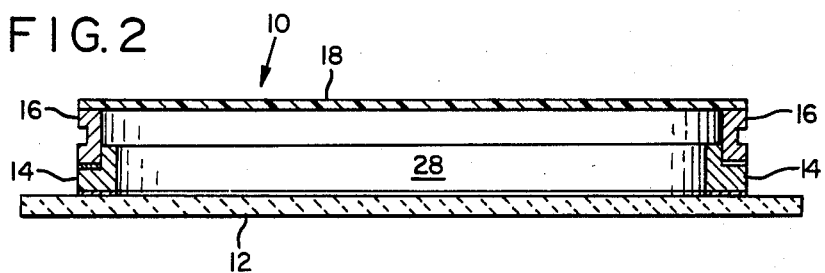
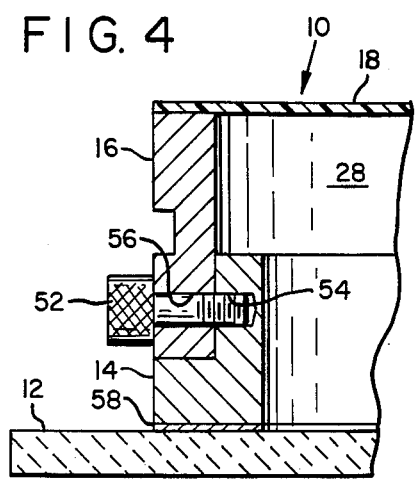
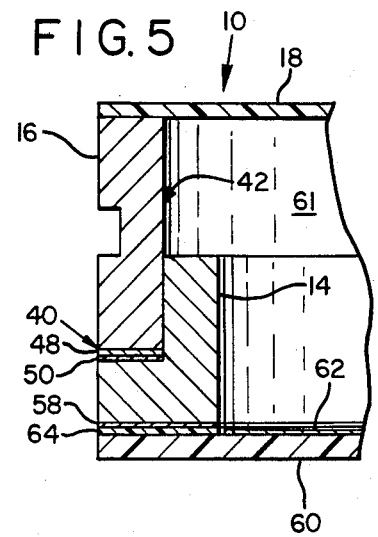

REMOVABLE PELLICLE AND METHOD

BACKGROUND OF THE INVENTION

The present invention relates to removable thin film mountings for photomasks used in the manufacture of semiconductor devices. It is well known that pattern transfer from the photomask to substrate is accomplished by exposing the mask to a light source. The patterns on the photomask are projected onto the substrate which has been treated with a photo-sensitive substance. Any foreign substance on the surface of the mask will interfere with the proper pattern being transferred to the substrate.

To eliminate particulate surface contamination of the mask surface, a framed thin film known as a pellicle is mounted on the mask surface, so that any contamination which would ordinarily be deposited on the mask surface, is held off from the surface by the pellicle. The frame supports the film at a sufficient distance from the mask surface that any particles on the film will be out of focus during the lithographic process, and therefore will not be projected onto the substrate.

Currently, pellicles are mounted directly to the surface of the mask by use of a double-sided adhesive. When it becomes necessary to replace the pellicle, the entire pellicle is removed from the mask. The adhesive often leaves residue on the mask surface, requiring the use of cleaning agents. However, this very act of cleaning the mask can increase contamination. Therefore, following the cleaning procedure, reinspection of the mask is required to ensure that its original quality has not been affected by the cleaning process. All of this increases the cost of pellicle replacement in terms of time, money and potential damage to the mask.

The present invention overcomes the drawbacks of the prior art by providing a composite frame for a freestanding membrane which includes a first member, means for mounting the first frame member to a planar surface such that a working area is defined on the planar surface, a second frame member having a first side for peripherally supporting the membrane, and means for removably mounting a second side of the second frame member to the first frame member so that the membrane protects and covers the working area.

Another aspect of the invention is a method for using a pellicle, which includes the steps of mounting a first frame member to a planar surface such that a working area is defined on the planar surface within the frame, and removably mounting a framed thin film or pellicle to the first frame member so that the working area is protected by the pellicle. In the event the pellicle needs to be replaced, the old pellicle is merely disengaged from the first frame member, and a new pellicle is mounted in its place. The first frame member remains in place on the planar surface so that the pellicle does not have to be directly affixed by adhesive to the planar surface.

BRIEF DESCRIPTION OF THE DRAWINGS

FIG. 1 is a plan view of a first, preferred embodiment of the present invention, shown mounted to a photomask;

FIG. 2 is an enlarged side elevation sectional view taken along line 2—2 of FIG. 1;

FIG. 3 is a fragmentary, enlarged side elevation sectional view of the embodiment of FIGS. 1 and 2;

FIG. 4 is a fragmentary, enlarged side elevation sectional view of an alternate embodiment; and FIG. 5 is a fragmentary, enlarged side elevation sectional view of another alternate embodiment, with a protective covering in place prior to mounting to the photomask.

DETAILED DESCRIPTION OF THE PREFERRED EMBODIMENT

The invention can be best understood by referring to the preferred embodiment shown in FIGS. 1 through 3. A composite frame 10 is shown to be mounted to a conventional photomask 12, although the details and configuration of the photomask have been deleted. Composite frame 10 is made up of a first frame member 14, a second frame member 16, and a thin film or membrane 18. Membrane 18 is permanently sealed along its periphery to a first or upper side 32 of second frame member 16, and this assembly including the second frame member and the membrane will sometimes herein be referred to as a pellicle.

FIGS. 2 and 3 show that second frame member 16 nests into first frame member 14, and that these two members are of complementary configuration. It is not necessary that first and second frame members 14 and 16 be circular as depicted, or even that they be of substantially similar configuration. It is only necessary that the configuration of the two members complements each other so that engagement between them is possible. In the depicted embodiment shown best in FIG. 3, first frame member 14 includes a first or upper side 22 comprised of a generally upwardly facing portion 24, and a laterally facing portion 26. Upwardly facing portion 24 faces away from photomask 12 and laterally facing portion 26 faces away from a working area 28 which is defined between composite frame 10 and the photomask 12. First frame member 14 also includes a second or lower side 30 which is mounted to photomask 12.

Second frame member 16 includes a first or upper side 32 to which membrane 18 is adhesively, sealingly mounted, and a second or lower side 34, which includes a laterally and inwardly facing portion 36 and a downwardly facing portion 38.

It is normal that the engagement between first and second members 14 and 16 provides an airtight seal for the working area 28, but an airtight seal is not necessary as long as the engagement between the two members is sufficiently close that particulate cannot enter through the engaging portions of those members. The depicted configuration is desirable because to enter working area 28, particulate would have to pass through the substantially horizontal interface 40 between the upwardly facing portion 24 of first frame member 14 and the downwardly facing portion 38 of second frame member 16, and would then have to pass upwardly along the substantially vertical interface 42 between the laterally facing portions 26 and 36 of the first and second frame members 14 and 16, respectively. The additional advantage of the depicted configuration is that the actual engagement or sealing means between first and second frame members is along horizontal interface 40, so that any particulate generated from this sealing means could not pass directly into the working area 28, but would have to migrate all the way up vertical interface 42 before reaching the working area.

The engagement seal between first and second frame members 14 and 16 is not designed to provide a permanent engagement between these members. The first frame member, on the other hand, is designed to be rigidly mounted to photomask 12. By providing this type of combination mounting, the pellicle can be removed and replaced without having to recreate the actual seal of the pellicle to the photomask.

In the preferred embodiment of FIGS. 2 and 3, a weak, removable adhesive 44 is provided along horizontal interface 40 to provide the removable seal required by the present invention. With such a seal, second frame member 16 and membrane 18 carried by it, can be removed from first frame member 14 by using a removal tool which would engage the second frame member along a grasping indentation 46.

As shown in FIG. 4, a mechanical engagement means may alternatively be provided between first and second frame members 14 and 16. One such mechanical engagement means would include a threaded pin, such as that shown at 52. In this design, first and second frame members 14 and 16 would include threaded portions 54 and 56, respectively, which would be sized to receive threaded pin 52. While a threaded pin 52 has been depicted, it may be desirable in other applications to include a spring-biased pin (not shown) which would extend between the first and second frame members 14 and 16.

Another means for sealing the horizontal interface 40 between the first and second frame members 14 and 16 is depicted in FIG. 5. In this alternate embodiment, two strips 48 and 50 of double-sided tape are positioned at horizontal interface 40. Each double-sided adhesive tape 48 and 50 is designed such that the side adjacent the respective frame member provides a stronger bond than on the side adjacent the other piece of double-sided tape. Therefore, when second frame member 16 is pulled away from first frame member 14, the seal will break between the two pieces of tape, and will not cause either of the pieces of adhesive tape to pull away from the member to which they are mounted. Conventional double-sided tape may be used for this purpose, with one suitable tape being "Frisk Film", manufactured by Frisk Products, Inc., and another being "Scotch Brand, Magic Plus Removable Transparent Tape", manufactured by the 3M Company. Other possible adhesive tapes include 3M "721" or "723" or "Mactac 2904" manufactured by Morgan Adhesive Company.

The mounting between first frame member 14 and photomask 12 should be a very strong one because first frame member 14 must be retained in position on photomask 12 even when the engagement between the first and second frame members is broken. This engagement normally consists of a strong bonding double-sided tape such as that shown at 58 in FIGS. 2 and 3. This tape is of conventional design and may be of the type mentioned above, except that it must provide a stronger bond than that present between the first and second frame members.

During shipment and prior to mounting of the composite frame 10 to a photomask 12, the interior portions of the compound frame 10 must be kept as clean and dust-free as possible. This is done by providing a protective covering along the underside of the structure, which covering has been indicated at 60, and which is described in more detail in my pending patent application entitled "A Method for Producing Contamination-Free Pellicles", Ser. No. 06/527,251 and now abandoned. Thus, at the factory during assembly of composite frame 10, the protective covering 60 is applied to the second or lower side 30 of first frame member 14 to seal the inner area 61 of the composite frame. An adhesive 62 should be applied to the upper or inner surface of protective covering 60, so that any particulate which has entered area 61 during fabrication and assembly will adhere thereto.

Because the bond between the second or lower side of first frame member 30 and protective covering 60 must be broken prior to mounting of the composite frame 10 to the photomask 12, it is desirable that some releasing means be provided between the protective covering and the first frame member. This releasing means, identified at 64 in FIG. 5, is typically in the form of a polyester liner having a releasing agent coated on both sides. Suitable releasing agent is sold by 3M as type 721 or 723 agent. Alternatively, a releasing agent may be used between the protective covering and the first frame member.

It should be understood that various changes in the depicted embodiment may be possible by those with ordinary skill in the art, and such changes are encompassed by the following claims.

It is claimed and desired to secure by Letters Patent:

1. A composite frame for a free-standing, protective membrane comprising:
    a first frame member;
    means for mounting said first frame member to a planar surface such that a working area is defined on the surface within said first frame member;
    a second frame member having a first side for peripherally supporting the membrane, and a second side; and
    means for removably mounting said second side of said second frame member to said first frame member so that the membrane protects and covers the working area.

2. The composite frame of claim 1, wherein the defined working area is no smaller than the surface area of the membrane to be mounted.

3. The composite frame of claim 1 or 2, wherein said frame members are of corresponding configuration which generally follows the periphery of the membrane to be mounted and which encloses the working area.

4. The composite frame of claim 1, wherein said means for mounting and removably mounting each provides an airtight mounting seal.

5. The composite frame of claim 1, wherein said means for removably mounting said second frame member to said first frame member comprises a first piece of double-sided adhesive tape having a first side mounted to said first frame member, and a second, opposite side facing toward said second frame member, with the degree of adhesion of said first side being stronger than the degree of adhesion provided by said second side.

6. The composite frame of claim 5, wherein said means for removably mounting said second frame member to said first frame member further comprises a second piece of double-sided adhesive tape having a first side mounted to said second frame member, and a second opposite side mounted to the second side of said first piece of tape, with the degree of adhesion between said pieces of tape being less than that between said first frame member and said first piece of tape.

7. The composite frame of claim 1, wherein said means for removably mounting said second frame member to said first frame member comprises mechanical fastening means.

8. The composite frame of claim 7, wherein said mechanical fastening means comprises a plurality of pin-like members which selectively engage said first and second frame members.

9. The composite frame of claim 1, further comprising the protective membrane which is peripherally supported by said second frame member.

10. A framed free-standing membrane comprising:
a membrane;
a first frame member encompassing and defining a working area corresponding to that of said membrane;
a second frame member of configuration corresponding to that of said first frame member;
means for peripherally mounting said membrane to a first side of said second frame member; and
means for removably mounting a second side of said second frame member to a first side of said first frame member.

11. The framed membrane of claim 10, wherein said first frame member further comprises means for mounting a second side thereof to a planar surface.

12. The framed membrane of claim 11, wherein said means for mounting said first frame member to a planar surface comprises double-sided adhesive tape having a first side mounted to said first frame member and further comprising a liner having a first side removably mounted to a second side of said double-sided adhesive tape, and a protective covering removably mounted to a second side of said liner and conforming generally to the configuration of said membrane to protect the composite frame and said membrane prior to mounting to the planar surface.

13. The framed membrane of claim 10, further comprising a protective covering removably mounted to a second side of said first frame member and conforming generally to the configuration of said membrane to protect said membrane.

14. The framed membrane of claim 13, wherein said second side of said first frame member includes double-sided adhesive means for subsequently mounting said first frame member to a planar surface, and wherein said protective covering includes means for being removably mounted to said adhesive means.

15. The framed membrane of claim 12, 13 or 14, wherein said protective covering includes a particulate-collecting adhesive area facing said membrane.

16. The composite frame of claim 1 or 11, wherein said first frame member includes an upwardly facing portion which faces away from the planar surface, and a laterally facing portion which faces away from the working area, and wherein said second frame member includes a downwardly facing portion which complements and faces said upwardly facing portion, and a laterally facing portion which complements and faces said laterally facing portion of said first frame member, when said frame members are mounted to one another.

17. The composite frame of claim 16, wherein said upwardly and downwardly facing portions are substantially parallel to the planar surface and said laterally facing portions are substantially perpendicular to the planar surface when said first and second frame members are mounted to one another and said first frame member is mounted to the planar surface.

18. A method of using a pellicle comprising:
mounting a first frame member to a photomask surface such that a working area is encompassed and defined on the photomask within the frame member;
removably mounting a pellicle to the first frame member so that the working area is protected by the pellicle;
subsequently removing the pellicle from the first frame member while maintaining the first frame member in position on the planar surface; and
removably mounting a replacement pellicle to the first frame member.

* * * * *